United States Patent
Sun

(10) Patent No.: US 6,214,671 B1
(45) Date of Patent: Apr. 10, 2001

(54) METHOD OF FORMING DUAL GATE STRUCTURE

(75) Inventor: Shih-Wei Sun, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/223,151

(22) Filed: Dec. 30, 1998

(30) Foreign Application Priority Data

Dec. 16, 1998 (TW) .................................................. 87120923

(51) Int. Cl.$^7$ .................................................. H01L 21/336
(52) U.S. Cl. .............................................. 438/261; 438/265
(58) Field of Search .................................... 438/258, 517, 438/592, 597, 257, 241, 199, 232, 527, 486, 261

(56) References Cited

U.S. PATENT DOCUMENTS

| | | | |
|---|---|---|---|
| 5,512,502 | * | 4/1996 | Oostuka et al. .......................... 437/41 |
| 5,840,607 | * | 11/1998 | Yeh et al. ............................... 438/257 |
| 5,877,523 | * | 3/1999 | Liang et al. ............................ 257/315 |
| 5,943,592 | * | 8/1999 | Tsukamoto et al. .................... 438/486 |
| 5,977,561 | * | 11/1999 | Wu ........................................... 257/67 |
| 5,998,290 | * | 12/1999 | Wu et al. ................................ 438/595 |

* cited by examiner

*Primary Examiner*—John F. Niebling
*Assistant Examiner*—Viktor Simkovic

(57) ABSTRACT

A method of forming a dual gate structure provides a substrate, in which a first well with a first conductive type and a second well with a second conductive type are formed. An isolation structure is formed between the first well and the second well. A gate oxide layer is formed on the substrate. A polysilicon layer is formed on the gate oxide layer. A part of the polysilicon layer positioned on the first well is doped to become a first type polysilicon layer. Another part of the polysilicon layer positioned on the second well is doped to become a second type polysilicon layer. An undoped polysilicon layer is formed on the doped polysilicon layer. A part of the undoped polysilicon and a part of the doped polysilicon layer are removed to form a first gate on the first well and a second gate on the second well. Spacers are formed on the sidewalls of the first gate and on the second gate. Source/drain regions are formed in the substrate beside the first gate and the second gate. Silicide is formed on the first gate, the second gate and the source/drain regions by self-alignment to form a dual gate structure comprising the first gate and the second gate.

14 Claims, 4 Drawing Sheets

METHOD OF FORMING DUAL GATE STRUCTURE

BACKGROUND OF THE INVENTION

1. Field of the Invention

The invention relates to a method of fabricating a gate of a semiconductor device, and more particularly, to a method of forming a dual gate.

2. Description of the Related Art

As semiconductor fabrication has reached the deep submicron stage, gates need to be formed with increasingly smaller dimensions, and with increasingly faster operation speed. The operation voltage is thus lowered, and consequently a change in material and fabrication must be made to avoid any device instability.

Conventionally, in either an N-channel metal-oxide semiconductor (NMOS) or a P-channel metal-oxide semiconductor (PMOS), a gate is formed of a polysilicon layer doped with N-type ions. A tungsten silicide layer and a silicon nitride layer are then formed on the gate. While forming a PMOS, an ion implantation is performed to an N-well or an N-type substrate for adjusting the threshold voltage of the PMOS. As a consequence, a PN junction is formed to induce a depletion region. The induced depletion region induces an equivalent buried channel device that causes a short channel effect, so that problems arise, such as sub-threshold voltage and an inability of the gate to control the device.

Due to the above problems, a method of doping P-type ions into a polysilicon gate of a PMOS has been developed. Thus, a complementary MOS (CMOS) comprising two gates doped with different conductive types has been formed and has become a leading trend for further development of gate fabrication. For example, embedded dynamic random access memory (Embedded DRAM) employs this type of gate.

FIG. 1A to FIG. 1D show a conventional method of fabricating a dual gate. In FIG. 1A, a substrate 100 is provided. Using ion implantation, an N-well 101 and a P-well 102 are formed in the substrate 100. A shallow trench isolation 103 is formed between the N-well 101 and P-well 102 for isolation. A gate oxide layer 104 is formed on the substrate 100. A polysilicon layer 105 is formed on the gate oxide layer 104. The part of the polysilicon layer 105 over the P-well 102 is covered by a photoresist layer 106, while the other part polysilicon layer 105 over the N-well 101 is exposed. N-type ions are implanted into the exposed part of the polysilicon layer 105.

In FIG. 1B, the photoresist layer 106 is removed. Another photoresist layer 107 is formed to cover the part of the polysilicon layer 105 over the N-well 101, and the polysilicon layer 105 over the P-well 102 is exposed. P-type ions are implanted into the exposed part of the polysilicon layer 105.

In FIG. 1C, the photoresist layer 107 is removed. A high temperature diffusion is performed to define the N-type polysilicon layer 105a on the N-well 101 and the P-type polysilicon layer 105b on the P-well 102. A part of the N-type polysilicon layer 105a and a part of the P-type polysilicon layer 105b are removed to form an N-type gate 105a on the N-well 101 and a P-type gate 105b on the P-well 102. Spacers 109 are formed on the sidewalls of the N-type gate 105a and on the P-type gate 105b. Source/drain regions 111a and 111b are formed in the in the substrate beside the N-type gate 105a and the P-type gate 105b, respectively.

In FIG. 1D, a titanium layer (not shown) is formed on the N-type gate 105a and the P-type gate 105b. A thermal process is performed to form self-aligned silicide on the N-type gate 105a, the P-type gate 105b and the source/drain regions 111a, 111b. The remaining titanium layer is removed.

Since the silicide 113 is formed from titanium and doped polysilicon, the silicide 113 has a high resistance. To decrease the resistance of the silicide, dopant concentration in the polysilicon is limited. However, a doping concentration of the N-type polysilicon and a doping concentration of the P-type polysilicon are lower, and the area of a depletion region between the P-type polysilicon and the N-type polysilicon is larger.

SUMMARY OF THE INVENTION

It is therefore an object of the invention to provide a method of forming a dual gate structure to form silicide with a low resistance on a gate and a source/drain region by self-alignment.

It is another object of the invention to provide a method of forming a dual gate structure. The dual gate structure comprises an N-type gate and a P-type gate. A depletion region between the N-type gate and the P-type gate is smaller than a convention dual gate structure.

The invention achieves the above-identified objects by providing a method of forming a dual gate structure. A substrate is provided. A first well with a first conductive type and a second well with a second conductive type are formed in the substrate. An isolation structure is formed between the first well and the second well. A gate oxide layer is formed on the substrate. A polysilicon layer is formed on the gate oxide layer. A part of the polysilicon layer positioned on the first well is doped to become a first-type polysilicon layer. Another part of the polysilicon layer positioned on the second well is doped to become a second-type polysilicon layer. An undoped polysilicon layer is formed on the doped polysilicon layer. A part of the undoped polysilicon and a part of the doped polysilicon layer are removed to form a first gate on the first well and a second gate on the second well. Spacers are formed on the sidewalls of the first gate and on the second gate. Source/drain regions are formed in the substrate beside the first gate and the The exposed portions of oxide layer beside the gate structures are removed. second gate. Silicide is formed on the first gate, the second gate and the source/drain regions by self-alignment to form a dual gate structure comprising the first gate and the second gate.

The gate formed according to the invention comprises a silicide layer. The silicide layer is formed from a metal layer reacting with the undoped polysilicon layer so that the silicide layer has a lower resistance than a conventional silicide layer. Furthermore, the doped polysilicon layer is not used to form the silicide layer. Dopant concentration of the doped polysilicon layer does not affect the resistance of the silicide layer. The dopant concentration can be increased to reduce the depletion region between the P-type gate and the N-type gate.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
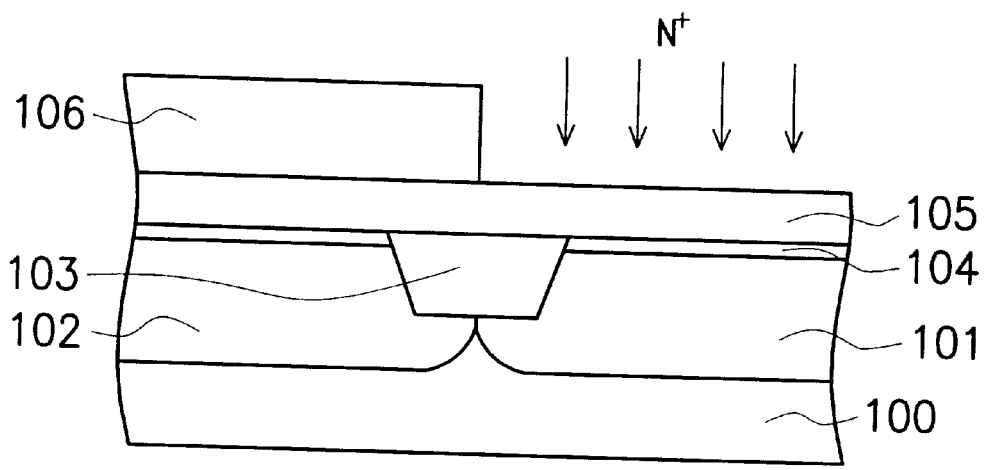
FIGS. 1A to 1D are schematic, cross-sectional views showing a conventional method for fabricating a dual gate.
Figure 1B:
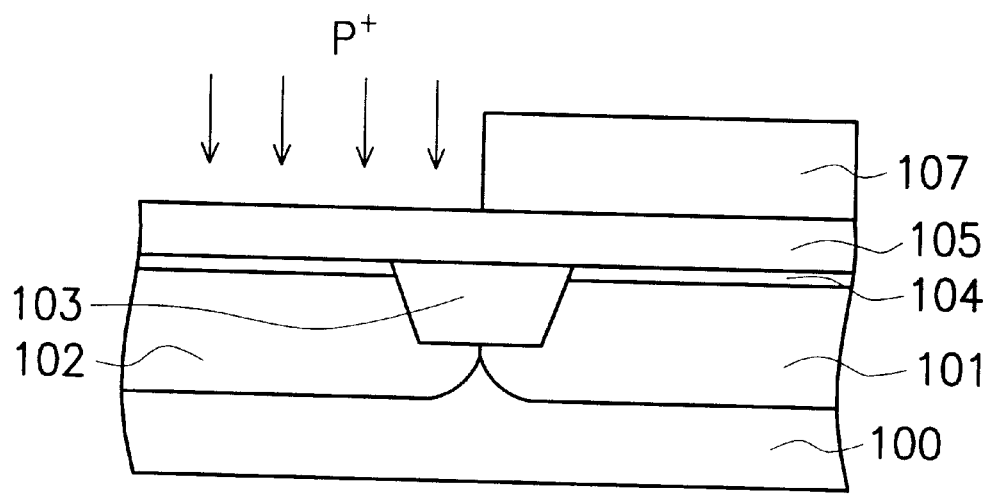
Figure 1C:
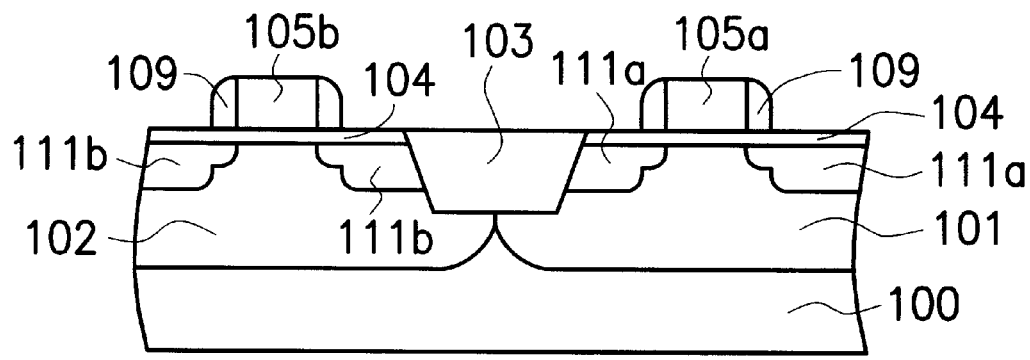
Figure 1D:
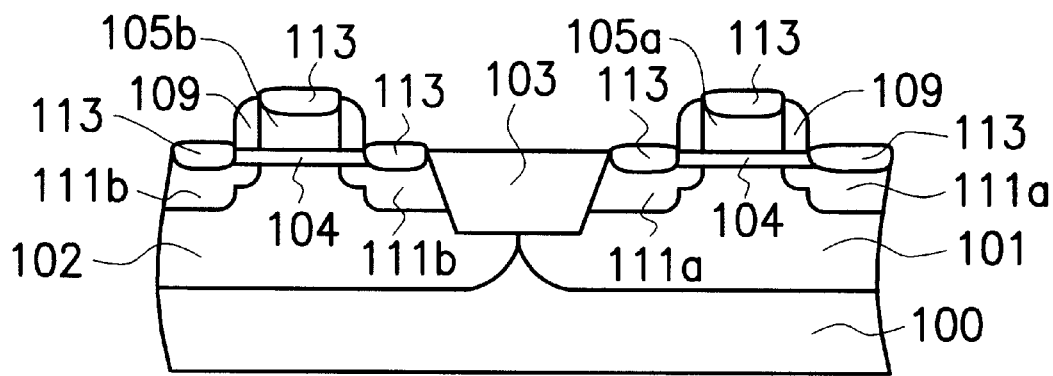

FIGS. 2A to 2F are schematic, cross-sectional views showing a method for fabricating a dual gate in a preferred embodiment according to the invention. In FIG. 2, a substrate 200 is provided. A first well 202 with a first conductive type and a second well 204 with a second conductive type are formed in the substrate 200. An isolation structure 206, such as shallow trench isolation, is formed between the first well 202 and the second well 204. A gate oxide layer 208 is formed on the substrate 200, for example, by thermal oxidation. A doped polysilicon layer 210 is formed on the gate oxide layer 208, for example, by low pressure chemical vapor deposition (LPCVD).

A photolithography process is performed using a photoresist layer 212 to dope ions with the first conductive type into a part of the polysilicon layer 210a (FIG. 2B) positioned over the first well 202. The ions cannot be doped into another part of the polysilicon layer 210 covered by the photoresist layer 212. In the figure, N-type represents the first conductive type and P-type represents the second conductive type. However, in actual fact, the first conductive type may be P-type and the second conductive type may be N-type. A preferred N-type ion comprises phosphorus or arsenic. A preferred P-type ion comprises boron.

Figure 2A:
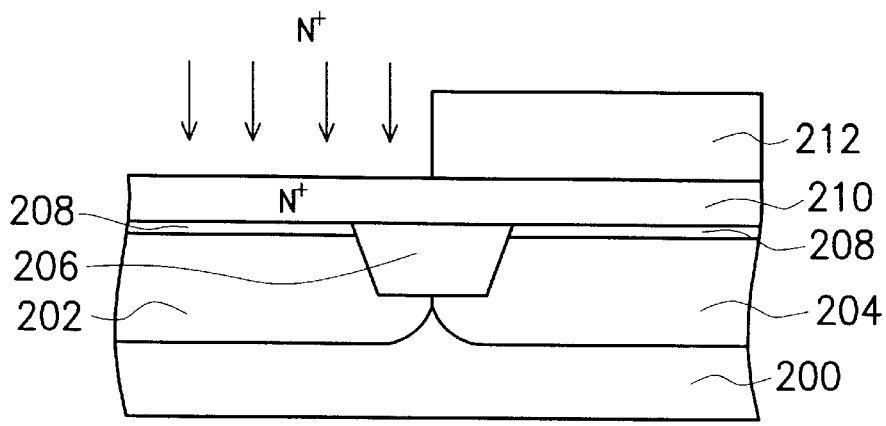
FIGS. 2A to 2F are schematic, cross-sectional views showing a method for fabricating a dual gate in a preferred embodiment according to the invention.
Figure 2B:
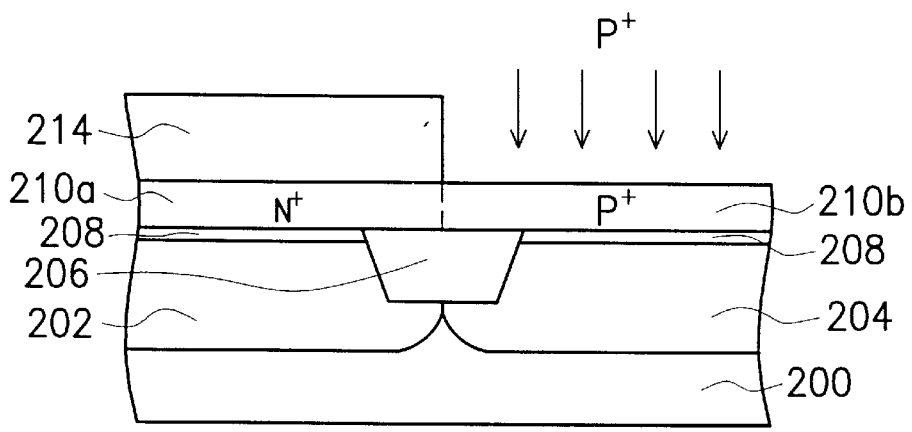

In FIG. 2B, a photolithography process is performed using another photoresist layer 214 to dope ions with the second conductive type into the polysilicon layer 210b positioned over the second well 204. At this step, the ions with the second conductive type cannot be doped into the polysilicon layer 210a positioned over the first well 202.

Figure 2C:
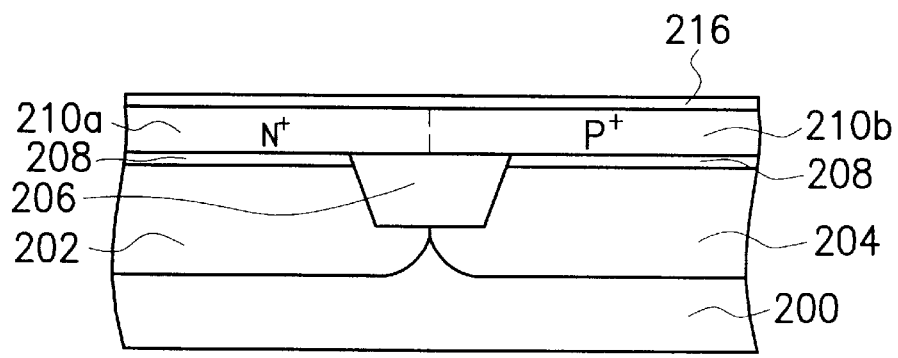

In FIG. 2C, an undoped polysilicon layer 216 with a thickness of about 200–1000Å is formed on the doped polysilicon layer 210.

Figure 2D:
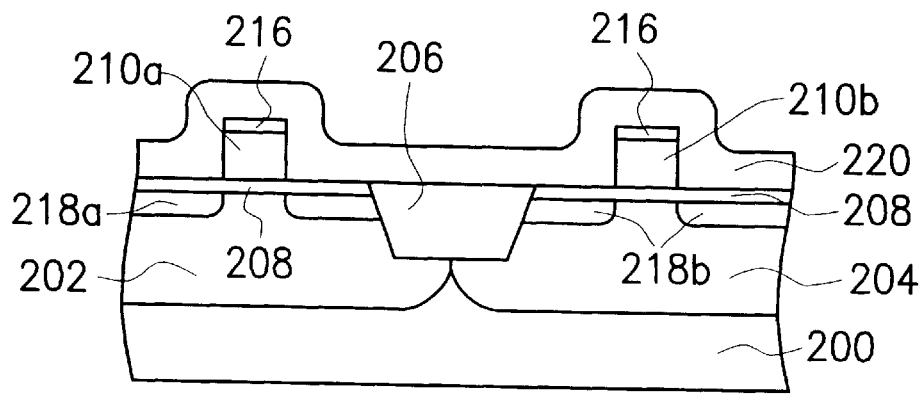

In FIG. 2D, a part of the undoped polysilicon layer 216 and a part of the doped polysilicon layer 210 are removed to form a first gate on the first well 202 and to form second gate on the second well 204. The first gate comprises the undoped polysilicon layer 216 and the polysilicon layer 210a with the first conductive type. The second gate comprises the undoped polysilicon layer 216 and the polysilicon layer 210b with the second conductive type.

Lightly doped region 218a and 218b are respectively formed beside the first gate in the first well 202 and beside the second gate in the second well 204. The lightly doped regions 218a, 218b are formed, for example, by ion implantation. The top surface of the undoped polysilicon layer 216 of the first gate and of the second gate is oxidized to form a thin first oxide layer. The oxidation temperature is about 800° C. A second oxide layer is formed on the structure described above. Since the first oxide layer and the second oxide layer have the same chemistry, number 220 is used to represent a oxide layer comprising the first oxide layer and the second oxide layer.

Figure 2E:
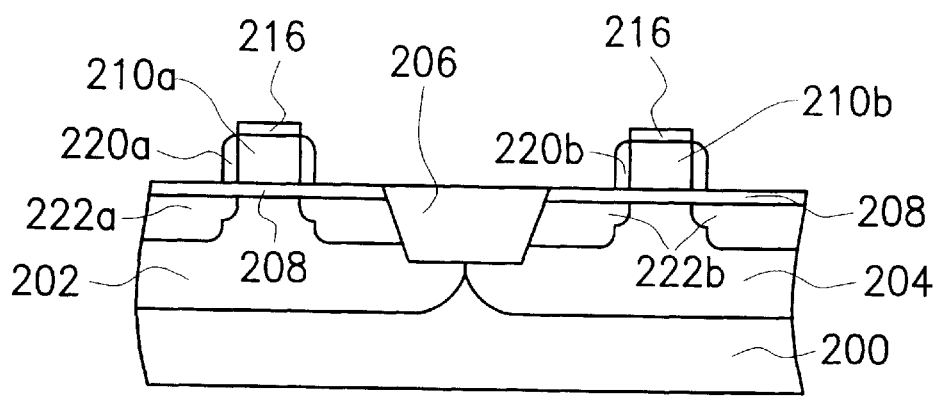

In FIG. 2E, the oxide layer 220 is etched back until exposing the undoped polysilicon layer 216. Spacers 220a, 220b are thus respectively formed on the sidewalls of the first gate and of the second gate. The etching back process can be controlled to expose the sidewall of the undoped polysilicon layer 216 or not. Source/drain regions 222a, 222b are respectively formed in the first well 202 and in the second well 204. The exposed portions of oxide layer beside the gate structures are removed.

Figure 2F:
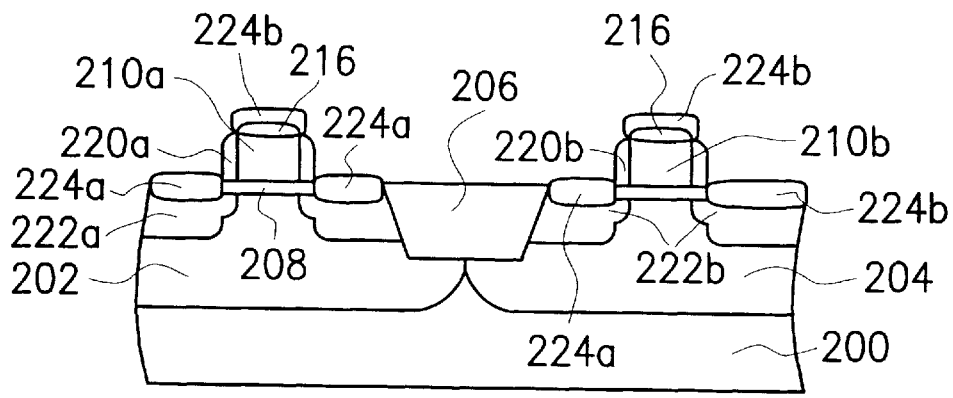

In FIG. 2F a metal layer (not shown) is formed on the structure. A preferred material of the metal layer comprises titanium. The metal layer reacts with the undoped polysilicon layer 216 and the source/drain regions 222a, 222b to form silicide layers 224a, 224b. The remaining metal layer is removed, for example, by wet etching. Since the silicide layers 224a, 224b are formed from the undoped polysilicon layer 216, the silicide layers 224a, 224b have a lower resistance than a conventional silicide layer.

Furthermore, the doped polysilicon layer 210 does not react with the metal layer so that dopant in the doped polysilicon layer 210 does not affect the resistance of the silicide layers 224a, 224b. The etching back process is controlled to determine the exposed area of the undoped polysilicon layer 216. The exposed area of the undoped polysilicon layer 216 is larger, and the silicide layer 224b on the undoped polysilicon layer 216 has a larger area.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a dual gate, comprising the steps of:

providing a substrate with an isolation structure therein;

forming a first well with a first conductive type and a second well with a second conductive type in the substrate, wherein the first well and the second well are isolated from each other by the isolation structure;

forming a gate oxide layer on the substrate;

forming a doped polysilicon layer on the gate oxide layer;

doping a part of the doped polysilicon layer positioned on the first well to make a doped polysilicon layer with the first conductive type;

doping the doped polysilicon layer positioned on the second well to make a doped polysilicon layer with the second conductive type;

forming an undoped polysilicon layer to form a first gate on the first well and to form a second gate on the second well, wherein the first gate comprises the doped polysilicon layer with the first conductive type and the second gate comprises the doped polysilicon layer with the second conductive type;

forming a first oxide layer on a top surface of the undoped polysilicon layer by thermally oxidizing the undoped polysilicon layer;

forming a second oxide layer over the substrate and covering the first oxide layer;

etching back the second oxide layer and the first oxide layer to form spacers on the sidewalls of the first gate and of the second gate and to expose the undoped polysilicon layer;

and forming a silicide layer on the exposed, undoped polysilicon layer.

removing an exposed portion of the gate oxide layers and forming a silicide layer on the exposed, undoped polysilicon layer.

2. The method according to claim 1, wherein the first conductive type is N-type and the second conductive type is P-type.

3. The method according to claim 1, wherein the first conductive type is P-type and the second conductive type is N-type.

4. The method according to claim 1, wherein the thickness of the undoped polysilicon layer is about 200–1000Å.

5. The method according to claim 1, wherein a material of the silicide layer comprises titanium silicide.

6. A method of forming a dual gate, comprising the steps of:

provPath a substrate in which a first well with a first conductive type and a second well with a second conductive type are formed;

forming a gate oxide layer on the substrate;

forming a first doped polysilicon layer positioned over the first well and a second doped polysilicon layer positioned over the second well;

forming an undoped polysilicon layer on the first doped polysilicon layer and the second doped polysilicon layer;

removing a part of the undoped polysilicon layer, a part of the first doped polysilicon layer and a part of the second doped polysilicon layer to form a first gate on the first well and to form a second gate on the second well;

forming a first oxide layer on a top surface of the undoped polysilicon layer by thermally oxidizing the undoped polysilicon layer:

forming a second oxide layer over the substrate and covering the first oxide layer;

etching back the second oxide layer and the first oxide layer to form spacers on the sidewalls of the first gate and of the second gate and to expose the undoped polysilicon layer; and forming a silicide layer on the exposed undoped polysilicon layer.

7. The method according to claim 6, wherein the first conductive type is N-type and the second conductive type is P-type.

8. The method according to claim 6, wherein the first conductive type is P-type and the second conductive type is N-type.

9. The method according to claim 6, wherein the thickness of the undoped polysilicon layer is about 200–1000Å.

10. The method according to claim 6, wherein a material of the silicide layer comprises titanium silicide.

11. The method according to claim 6, wherein the step of forming the spacers further exposes the sidewall of the undoped polysilicon layer.

12. A method of forming a self-aligned silicide, comprising the steps of:

providing a substrate;

forming a doped polysilicon layer on the substrate;

forming an undoped polysilicon layer over the doped polysilicon layer;

removing a part of the undoped polysilicon layer and a part of the doped polysilicon layer to form a gate on the substrate;

forming a first oxide layer on a top surface of the undoped polysilicon layer by thermally oxidizing the undoped polysilicon layer:

forming a second oxide layer over the substrate and covering the first oxide layer;

etching back the second oxide layer and the first oxide layer to form a spacer on the sidewall of the gate and to expose the undoped polysilicon layer; and forming a silicide layer from the exposed undoped polysilicon layer on the gate by self-alignment.

13. The method according to claim 12, wherein the thickness of the undoped polysilicon layer is about 200–1000Å.

14. The method according to claim 12, wherein the spacer further exposes the sidewall of the undoped polysilicon layer on the gate.

* * * * *